(12) United States Patent
Yamasaki et al.

(10) Patent No.: US 8,031,751 B2
(45) Date of Patent: Oct. 4, 2011

(54) NITRIDE SEMICONDUCTOR LASER DEVICE

(75) Inventors: Yukio Yamasaki, Daito (JP); Kei Yamamoto, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 104 days.

(21) Appl. No.: 12/232,588

(22) Filed: Sep. 19, 2008

(65) Prior Publication Data

US 2009/0080485 A1    Mar. 26, 2009

(30) Foreign Application Priority Data

Sep. 21, 2007   (JP) ................ 2007-244982

(51) Int. Cl.
 *H01S 3/04* (2006.01)
(52) U.S. Cl. ........ 372/34; 372/36; 372/50.1; 372/50.12
(58) Field of Classification Search .............. 372/34, 372/36, 50.1, 50.12
See application file for complete search history.

(56) References Cited

U.S. PATENT DOCUMENTS

| 5,099,488 | A * | 3/1992 | Ahrabi et al. | 372/36 |
| 5,311,530 | A * | 5/1994 | Wagner et al. | 372/36 |
| 7,154,926 | B2 * | 12/2006 | Kouta et al. | 372/38.05 |
| 2003/0067950 | A1 * | 4/2003 | Hanaoka | 372/34 |
| 2003/0118292 | A1 * | 6/2003 | Kitaoka et al. | 385/91 |
| 2004/0027631 | A1 * | 2/2004 | Nagano et al. | 359/196 |
| 2004/0233964 | A1 * | 11/2004 | Yamanaka et al. | 372/108 |
| 2005/0141584 | A1 * | 6/2005 | Ohe et al. | 372/108 |

FOREIGN PATENT DOCUMENTS

| JP | 02-177583 | 7/1990 |
| JP | 03-006875 | 1/1991 |
| JP | 05-037089 | 2/1993 |
| JP | 08228044 A * | 9/1996 |
| JP | 2003-332673 | 11/2003 |
| JP | 2004-103735 | 4/2004 |
| JP | 2005-032937 | 2/2005 |

OTHER PUBLICATIONS

Imanishi, D. et al., Electronics Letters, Oct. 2005, vol. 41, No. 21, pp. 1172-1173.
Kabushiki Kaisha Baifukan "Semiconductor lasor" First Edition Apr. 25, 1989, pp. 233-234, + Eng. abstract.

* cited by examiner

*Primary Examiner* — Kinam Park
(74) *Attorney, Agent, or Firm* — Harness, Dickey & Pierce, P.L.C.

(57) ABSTRACT

The present invention relates to a nitride semiconductor laser device having a structure in which two or more of nitride semiconductor laser elements, having at least a first electrode on a first main surface of a first conductive type conductive substrate, having at least a first conductive type nitride semiconductor layer, an active layer, a second conductive type nitride semiconductor layer, and a second electrode on a second main surface of the conductive substrate, and having a stripe-waveguide structure parallel to the first main surface, are arranged in a direction parallel to the first main surface and a direction perpendicular to the direction of light that is emitted from the stripe waveguide structure in the nitride semiconductor laser device, and the first sub-mount and the first electrode of the nitride semiconductor laser element are electrically and heat-conductively connected, and the second sub-mount and the second electrode of the nitride semiconductor laser element are electrically and heat-conductively connected.

16 Claims, 9 Drawing Sheets

AVERAGE TEMPERATURE
OF PN JUNCTION PLANE
OF NITRIDE SEMICONDUCTOR
LASER ELEMENT

NITRIDE SEMICONDUCTOR LASER DEVICE

This nonprovisional application is based on Japanese Patent Application No. 2007-244982 filed on Sep. 21, 2007 with the Japan Patent Office, the entire contents of which are hereby incorporated by reference.

BACKGROUND OF THE INVENTION

1. Field of the Invention

The present invention relates to a nitride semiconductor laser device, and also to a nitride semiconductor laser device that is provided with a nitride semiconductor laser element having a high output.

2. Description of the Background Art

A high output semiconductor laser element can obtain a watt-level output of light. Such semiconductor laser element can be used in a processing field, a medical field, and the like using a laser beam.

Further, in recent years, development of a nitride semiconductor laser element that emits a purple-blue laser beam for pickup of an optical disk has been carried out, and it is coming to a stage of practical use. However, at present, among the semiconductor laser elements, a nitride semiconductor laser element that can obtain a watt-level output of light has not come to a stage of practical use yet. The wavelength of the purple-blue laser beam in the nitride semiconductor laser element is as short as about 400 nm. Therefore, the development of a nitride semiconductor laser element having a high light output is desired from a viewpoint of widening the application range of the processing field and the medical field using a laser beam.

Further, in recent years, an illumination device in which a semiconductor light emitting element and a phosphor are combined and used has been developed to use in place of a conventional illumination device such as an incandescent lamp or a fluorescent tube, and some of them are put to practical use. One example of the semiconductor light emitting element is a light emitting diode having a III-V group compound semiconductor as a light emitting layer. The light emitting diode can emit light of various colors such as red light, blue light, and white light.

An illumination device using a light emitting diode has advantages that it is small in size, inexpensive, low in power consumption, and long in life compared with a conventional illumination device such as an incandescent lamp or a fluorescent tube. However, an illumination device using the light emitting diode cannot obtain as large an output as the conventional illumination device. Then, at present, an illumination device using the light emitting diode is mainly used no more than as back light, an illumination, or an indicator of a display.

Here, in the case of using the above-described nitride semiconductor laser element having a watt-level output of light as a light source of the illumination device, the electricity-light conversion efficiency as a light source is extremely high compared with the case of using a light emitting diode as the light source of the illumination device, and it is expected that a drastically higher output can be achieved.

In the case of using a nitride semiconductor laser element as the light source, the light output that is obtained from the light source is about 0.3 to 1 W (for example, 0.5 W). Then, in order to realize stable operation at which the light output of the nitride semiconductor laser element is 1 W or more, it is necessary to electrically connect two or more nitride semiconductor laser elements on one sub-mount in plurality.

Further, in order to operate the nitride semiconductor laser element by stabilizing the light output of the nitride semiconductor laser element at 1 W or more as described above, it is necessary to apply a current of about 0.5 A per nitride semiconductor laser.

In addition, the voltage that is necessary to operate the nitride semiconductor laser element is 3.5 V to 6 V. On the other hand, the voltage that is necessary to operate a general semiconductor laser element other than the nitride semiconductor laser element is 1.8 V to 2.5 V. Therefore, the voltage that is necessary for the operation of the nitride semiconductor laser element is high compared with the voltage that is necessary for the operation of the general semiconductor laser element, and the power that is necessary for the operation of the nitride semiconductor laser element is 0.5 A×5 V or more.

At this time, a large part of the power that is not converted into the light output of the power that is input into the nitride semiconductor laser element is converted into heat. The heat raises the temperature of the nitride semiconductor laser element, and not only are oscillation characteristics such as the light output and the oscillation wavelength affected, but also the heat affects seriously the life of the nitride semiconductor laser element. Therefore, when the nitride semiconductor laser element is packaged in a package, or the like, it is considered to improve thermal radiation characteristics of the nitride semiconductor laser element. For example, an arrangement in which a p-n junction plane side of the nitride semiconductor laser element is bonded to the sub-mount, that is, a so-called junction down arrangement, exposing a back surface side of a substrate of the nitride semiconductor laser element, can be adopted. Further, a structure of a semiconductor laser device using a plurality of heat sinks has been developed (for example, Japanese Patent Laying-Open No. 2005-032937).

Further, the semiconductor laser device in which a plurality of the semiconductor laser elements are packaged in order to obtain a high light output is investigated in Non-Patent Document 1 (Electronics Letters, October 2005, Vol. 41, No. 21, pp. 1172-1173) for example. In Non-Patent Document 1, a plurality of semiconductor laser elements are arranged on the sub-mount in a state that they are not separated into individual elements.

FIG. 13 is a schematic drawing showing a configuration of the nitride semiconductor laser device that is conventionally investigated. The nitride semiconductor laser device shown in FIG. 13 is packaged with a so-called junction down arrangement in which the p-n junction plane side of a nitride semiconductor laser element 10001 is bonded to a sub-mount 10002. Here, sub-mount 10002 is bonded to a heat sink 10003 that is welded to a stem 10004.

FIG. 14 shows a thermal resistance circuit network in the nitride semiconductor laser device shown in FIG. 13. In the nitride semiconductor laser device shown in FIG. 13, generated heat 30001 in a light emitting region of the nitride semiconductor laser element passes through a thermal resistance 30002 from the light emitting region of the nitride semiconductor laser element to a sub-mount upper-side surface. Then, generated heat 30001 passes through a thermal resistance 30003 to a heat sink upper-side surface from thermal resistance 30002 to the sub-mount upper-side surface. Finally, generated heat 30001 is radiated from thermal resistance 30003 to the heat sink upper-side surface through a thermal resistance 30004 to a housing in which the nitride semiconductor laser device is stored.

Other than the thermal resistances shown in FIG. 14, a thermal resistance corresponding to a path in which the heat is radiated by natural cooling from the nitride semiconductor laser element and the surfaces of the sub-mount and the heat sink and thermal resistance corresponding to a thermal path between a plurality of the nitride semiconductor laser elements exist. However, because the thermal resistances that are not shown in FIG. 14 are normally negligibly small compared with the thermal resistances shown in FIG. 14, they are neglected.

FIG. 15 shows the current-light output (I-L) characteristic of the nitride semiconductor laser device shown in FIG. 13. The horizontal axis represents the current (I) applied to the nitride semiconductor laser device, and the vertical axis represents the light output (L) of the nitride semiconductor laser device. In the following, the relationship between the current and the light output is expressed as an I-L characteristic.

In FIG. 15, the nitride semiconductor laser device shows a linear I-L characteristic for a current value lower than a point 20001. However, it deviates from an extension of the linear I-L characteristic in the range from point 20001 to a point 20002. Then, the I-L characteristic from point 20001 to point 20002 shows that the increase rate of the light output to the applied current becomes small compared with the I-L characteristic up to point 20001.

The phenomenon shown in FIG. 15 has its origin in that a decrease of the light output is caused by increasing the temperature of the nitride semiconductor laser device due to the generated heat from the nitride semiconductor laser element. Furthermore, at a higher current value than at point 20002, deterioration occurs of the nitride semiconductor laser device originated from the generated heat from the nitride semiconductor laser element, and an increase in the light output of the nitride semiconductor laser device shows saturation. Then, even when a current higher than at point 20002 is applied, the light output of the nitride semiconductor laser device shows a tendency of decreasing due to the deterioration of the nitride semiconductor laser device originated from an increase in the generated heat from the nitride semiconductor laser element.

SUMMARY OF THE INVENTION

As described above, in the development of a nitride semiconductor laser device that is provided with a nitride semiconductor laser element having a high light output, it is indispensable to investigate how to radiate the heat that is generated in the nitride semiconductor laser device outside efficiently.

Until now, in order to make the thermal radiation of the nitride semiconductor laser device better, the structure of the semiconductor laser and the material and the shape of the sub-mount have been investigated. However, an attempt to make the thermal radiation especially efficient has not been made.

The present invention was made in view of such situation and provides an improvement of the greater thermal radiation of the nitride semiconductor laser device by adding a new thermal radiation path in addition to the thermal radiation path of the conventional nitride semiconductor laser device.

The present invention relates to a nitride semiconductor laser device provided with a nitride semiconductor laser element and a sub-mount and having a structure in which the sub-mount includes a first sub-mount and a second sub-mount, the nitride semiconductor laser element has at least a first electrode on a first main surface of a first conductive type conductive substrate, has at least a first conductive type nitride semiconductor layer, an active layer, a second conductive type nitride semiconductor layer, and a second electrode on a second main surface of the conductive substrate, and has a stripe waveguide structure parallel to the first main surface, two or more nitride semiconductor laser elements are arranged in a direction parallel to the first main surface and a direction perpendicular to the direction of light that is emitted from the stripe waveguide structure, the first sub-mount and the first electrode of the nitride semiconductor laser element are electrically and heat-conductively connected, and the second sub-mount and the second electrode of the nitride semiconductor laser element are electrically and heat-conductively connected.

Further, in the nitride semiconductor laser device of the present invention, at least one of the first sub-mount and the second sub-mount is preferably constituted with a material having a heat conductivity of 100 W/m·K or more.

Further, in the nitride semiconductor laser device of the present invention, the first sub-mount and the second sub-mount are preferably constituted with a material selected from SiC, Cu, CuW, AlN, diamond, CuMo, and Ag.

Further, in the nitride semiconductor laser device of the present invention, the nitride semiconductor laser element preferably has one of the stripe waveguide structure.

Further, in the nitride semiconductor laser device of the present invention, a plurality of the nitride semiconductor laser elements are preferably in a state in which they are not separated from each other.

Further, in the nitride semiconductor laser device of the present invention, the dimension in the light emitting direction of the first sub-mount and the second sub-mount is preferably longer than the dimension in the light emitting direction of the nitride semiconductor laser element.

Further, in the nitride semiconductor laser device of the present invention, the dimension in the thickness direction of the nitride semiconductor laser element of the first sub-mount and the second sub-mount is preferably 0.2 mm or more and 10 mm or less.

Further, in the nitride semiconductor laser device of the present invention, a spacer made of an insulator having a thickness different from that of the nitride semiconductor laser element by 0 to 20 μm is preferably sandwiched between the first sub-mount and the second sub-mount at a position opposite to the nitride semiconductor laser element as observed from the center of gravity of the surface of the side in which the area of the surface parallel to the first main surface in the first sub-mount and the second sub-mount is smaller.

Further, in the nitride semiconductor laser device of the present invention, the first sub-mount and the second sub-mount are preferably connected with the nitride semiconductor laser element with a conductive adhesive material interposed therebetween.

Further, in the nitride semiconductor laser device of the present invention, the conductive adhesive material is preferably a eutectic material.

Further, in the nitride semiconductor laser device of the present invention, the eutectic material preferably has the same eutectic temperature in the first sub-mount side and the second sub-mount side.

Further, in the nitride semiconductor laser device of the present invention, each of the first sub-mount and the second sub-mount is preferably electrically and heat-conductively connected to a stem that is supporting an external terminal.

Further, in the nitride semiconductor laser device of the present invention, either one of the first sub-mount and the second sub-mount is preferably electrically and heat-conductively connected to the stem, and the other one is preferably electrically connected to the stem and has a thermal radiation structure.

Further, in the nitride semiconductor laser device of the present invention, the thermal radiation structure is preferably a structure in which either of the first sub-mount and the second sub-mount contacts with a heat emitting material having an emissivity of 0.7 or more.

Further, in the nitride semiconductor laser device of the present invention, the heat emitting material is preferably constituted of any material selected from alumina, a brick, concrete, lacquer, and paint.

Further, in the nitride semiconductor laser device of the present invention, the thermal radiation structure is preferably a fin structure.

In the present invention, the nitride semiconductor laser device refers to a device in which a nitride semiconductor laser element is installed in a mount member such as a sub-mount or a stem and is unified.

By adding a new thermal radiation path to the nitride semiconductor laser device, the thermal radiation of the nitride semiconductor laser device is improved further.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
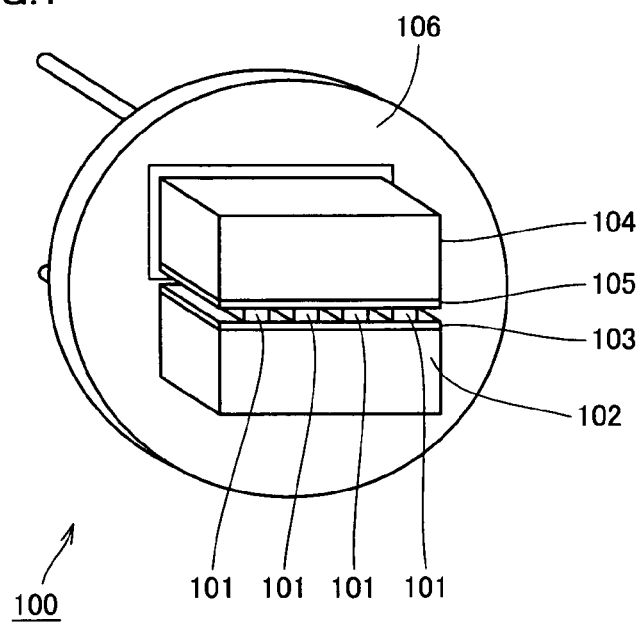
FIG. 1 is a schematic perspective drawing of a nitride semiconductor laser device in Embodiment 1.

In the following, embodiments of the present invention are described based on the drawings. The same reference numerals refer to the same or the corresponding part in the drawings below, and their description is not repeated. Further, dimensions such as the length, size, and width in the drawings are changed appropriately in order to clarify and simplify the drawings, and do not show the actual dimension.

Embodiment 1

<<Structure>>

FIG. 1 is a schematic perspective drawing of a nitride semiconductor laser device in Embodiment 1 of the present invention. In the following, description is made based on FIG. 1.

A nitride semiconductor laser device 100 of the present invention is provided with a nitride semiconductor laser element 101 and a sub-mount containing a first sub-mount 102 and a second sub-mount 104. Nitride semiconductor laser element 101 has at least a first electrode on a first main surface of a first conductive type conductive substrate, has a first conductive type nitride semiconductor layer, an active layer, a second conductive type nitride semiconductor layer, and a second electrode on a second main surface of the conductive substrate, and has a stripe waveguide structure parallel to the first main surface.

In nitride semiconductor laser device 100 of the present embodiment, two or more nitride semiconductor laser elements 101 are arranged in a direction parallel to the first main surface and in a direction perpendicular to the emitting direction of the light emitted from the stripe waveguide structure. The arrangement of the nitride semiconductor laser elements in the nitride semiconductor laser device is fixed with a structure in which first sub-mount 102 and the first electrode of nitride semiconductor laser element 101 are electrically and heat-conductively connected and second sub-mount 104 and the second electrode of nitride semiconductor laser element 101 are electrically and heat-conductively connected. First sub-mount 102 and nitride semiconductor laser element 101 are connected with a solder material 103. Further, second sub-mount 104 and nitride semiconductor laser element 101 are connected with a solder material 105. Each of first sub-mount 102 and second sub-mount 104 is connected to a stem 106 with a solder material (not shown). In the present embodiment, each of first sub-mount 102 and second sub-mount 104 is electrically and heat-conductively connected to stem 106 supporting an external terminal.

Here, in the present invention, the relationship between the first main surface and the second main surface of the conductive substrate is a relationship in which the opposite surface of the first main surface of the conductive substrate is the second main surface. Further, the first conductive type may be either of p type and n type, and the second conductive type is the opposite conductive type from the first conductive type.

The present invention has a structure in which a plurality of nitride semiconductor laser elements 101 are sandwiched by first sub-mount 102 and second sub-mount 104. With this structure, the connection state of nitride semiconductor laser element 101 and the plurality of first sub-mount 102 becomes uniform, and unevenness in the thermal radiation characteristic in each nitride semiconductor laser element 101 can be suppressed, and the applied electric power that is oscillated by nitride semiconductor laser element 101 can be unified.

Because second sub-mount 104 has a function of radiating heat by thermal conduction to the outside of nitride semiconductor laser device 100, the thermal radiation characteristic can be improved compared with the conventional nitride semiconductor laser device 100.

Furthermore, in the present embodiment, a plurality of elements are installed, namely, a plurality of the nitride semiconductor laser elements, that are in a state of being separated from each other, that is, ones that are provided with one stripe wave guide structure (described later) per independent nitride semiconductor laser element, are installed. With this method, nitride semiconductor laser elements having closely matching characteristics of the nitride semiconductor laser element can be selected and installed.

Further, in the present embodiment, the dimension in the thickness direction of nitride semiconductor laser element 101 in first sub-mount 102 and second sub-mount 104 is preferably 0.2 mm or more and 10 mm or less, and especially preferably 0.25 mm or more and 0.5 mm or less. In the case that the dimension is less than 0.2 mm, thermal conduction of the heat that is generated from nitride semiconductor laser element 101 to the surface direction perpendicular to the inside thickness of first sub-mount 102 and second sub-mount 104 becomes poor, and there is a fear that a problem is generated of which the substantial thermal resistance of first sub-mount 102 and second sub-mount 104 becomes low. In the case that the dimension exceeds 10 mm, the entire nitride semiconductor laser device 100 becomes large, and there is a fear that a substantial problem is generated.

Figure 2:
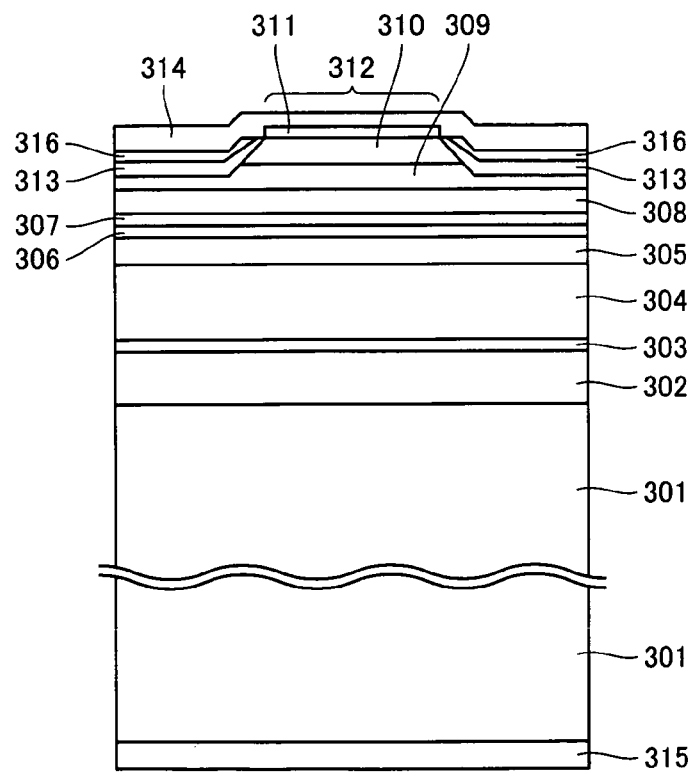
FIG. 2 is a schematic cross-sectional drawing showing a structure of an important part of the nitride semiconductor laser device in Embodiment 1.

FIG. 2 is a schematic cross-sectional drawing showing a structure of an important part of the nitride semiconductor laser device of the present embodiment. In nitride semiconductor laser element 101, an n-type layer 302, an n-type buffer layer 303, an n-type cladding layer 304, an n-type optical waveguide layer.305, an n-type active layer 306, a p-type carrier stop layer 307, a p-type optical waveguide layer 308, a p-type cladding layer 309, and a p-type contact layer 310 are layered and formed one by one. Furthermore, a ridge-shaped stripe 312 of 5 to 100 µm in width (10 µm for example) is formed on a part of the upper structure of n-type active layer 306 by etching to reach p-type cladding layer 309. In the present embodiment, n-type active layer 306 and n-type optical waveguide layer 308 have a stripe waveguide structure sandwiched by p-type cladding layer 309, the emitted light of n-type active layer 306 is confined in the stripe waveguide structure, and a laser oscillation operation is generated.

Further, a p-type contact electrode 311 is formed on p-type contact layer 310 that remained without being etched, and an insulation film 313 and a metal layer 316 of 0.1 µm or less in thickness are formed in the etched region. Further, a p-type electrode pad 314 of 1 to 5 µm in thickness (3 µm for example) is formed so as to contact with p-type contact electrode 310. In the present embodiment, a metallayer 316 is formed to improve the adhesiveness of insulation film 313 with p-type electrode pad 314, and Mo or the like is used for example. However, there is no hindrance in the characteristics of nitride semiconductor laser element 101 without the metal layer. An n-type electrode 315 is formed on the first main surface of n-type substrate 301. N-type substrate 301 is polished so that the thickness becomes 50 to 200 µm (100 µm for example), and it is designed so that the side width of nitride semiconductor laser element 101 becomes 300 to 400 µm.

In the present embodiment, at least one of the first sub-mount and the second sub-mount is preferably constituted with a material having a heat conductivity of 100 W/m·K or more. Specifically, at least one of the first sub-mount and the second sub-mount is preferably constituted with a material selected from SiC, Cu, CuW, AlN, diamond, Mo, and Ag. The heat conductivity described in the present specification can be obtained by a laser flash method, for example. However, the heat conductivity may be obtained by other methods.

Further, the solder material and a layer made of the solder material that is formed on the surface of the first sub-mount and the second sub-mount are formed over respective one entire surface of the first sub-mount and the second sub-mount. However, they may be formed to contact the entire of a plurality of the nitride semiconductor laser elements, and they may be formed on one part of one surface of the first sub-mount and the second sub-mount, respectively.

Further, in the present embodiment, the first sub-mount, the second sub-mount, and the nitride semiconductor laser elements are connected through interposing the solder material therebetween. However, it is not limited to this configuration. A conductive adhesive material can be used in the above-described connection. The conductive adhesive material is preferably a eutectic material. Because it can be mixed with the electrode material of the nitride semiconductor laser element at the atomic level, it is advantageous in electrical contact and heat conduction. Then, the eutectic temperature of the eutectic material is preferably the same as in the first sub-mount side and the second sub-mount side. Even when the eutectic material has the same eutectic temperature, since it is arranged with the nitride semiconductor laser element in between, and they do not melt at the same time, and there is no practical problem. As an example of the eutectic material, there is SnAgCu whose eutectic temperature is 217 to 225° C. A silver paste or the like may be used for example as the conductive adhesive material. However, because the heat conductivity of the silver paste is generally lower than that of a solder material, it is more desirable to use the solder material.

<<Operation>>

Figure 3:
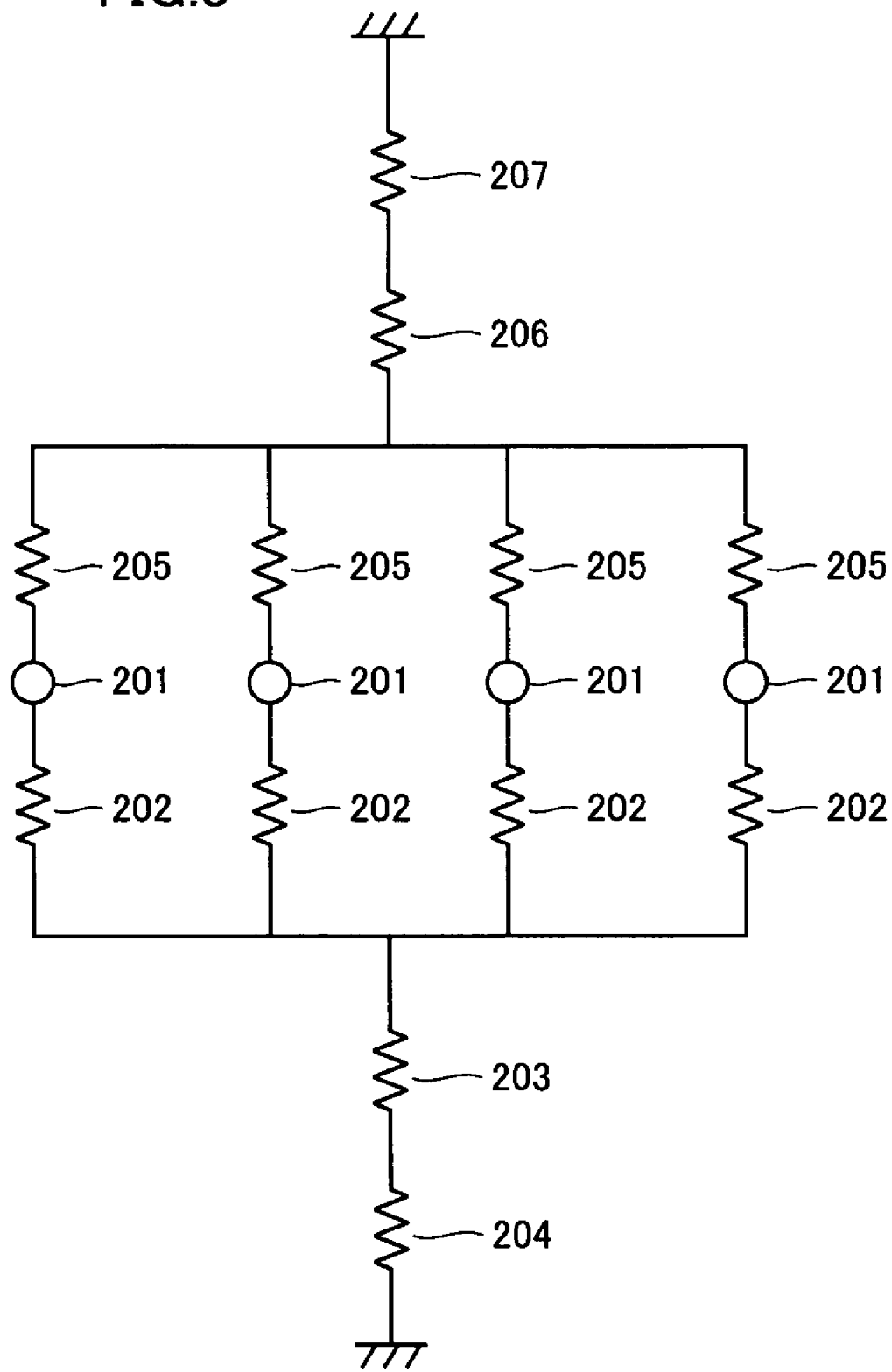
FIG. 3 is a schematic drawing showing a thermal resistance circuit network of the nitride semiconductor laser device in Embodiment 1.

FIG. 3 is a schematic drawing showing the thermal resistance circuit network of the nitride semiconductor laser device of the present embodiment. Other than the thermal resistance shown in FIG. 3, the thermal resistances that correspond to a thermal radiation path due to natural cooling from the surfaces of nitride semiconductor laser element 101, first sub-mount 102, and second sub-mount 104 exist in parallel. However, because it is normally sufficiently larger than the thermal resistance shown in the drawing and the heat flow that is radiated through this path is small enough to be ignored, it is neglected.

Generated heat 201 in the light emitting region of a plurality of nitride semiconductor laser elements 101 passes a thermal resistance 202 from the light emitting region of nitride semiconductor laser element 101 to the surface where first sub-mount 102 and nitride semiconductor laser element 101 contact. Next, generated heat 201 passes a thermal resistance 203 from thermal resistance 202 to the surface where first sub-mount 201 and stem 106 contact. Finally, generated heat 201 is radiated through a thermal resistance 204 from stem 106 to a housing in which nitride semiconductor laser device 100 is stored.

Because nitride semiconductor laser device 100 in the present embodiment has second sub-mount 104 besides first sub-mount 102, the efficiency of thermal radiation is better than a conventional nitride semiconductor laser device. That is, besides the thermal radiation that is originated from first sub-mount 102, generated heat 201 is radiated through thermal resistance 206 from a thermal resistance 205 to the surface where second sub-mount 104 and nitride semiconductor laser element 101 contact with the surface where second sub-mount 104 and stem 106 contact, and finally through thermal resistance 207 from stem 106 to the housing (not shown) in which nitride semiconductor laser device 100 is stored.

Figure 14:
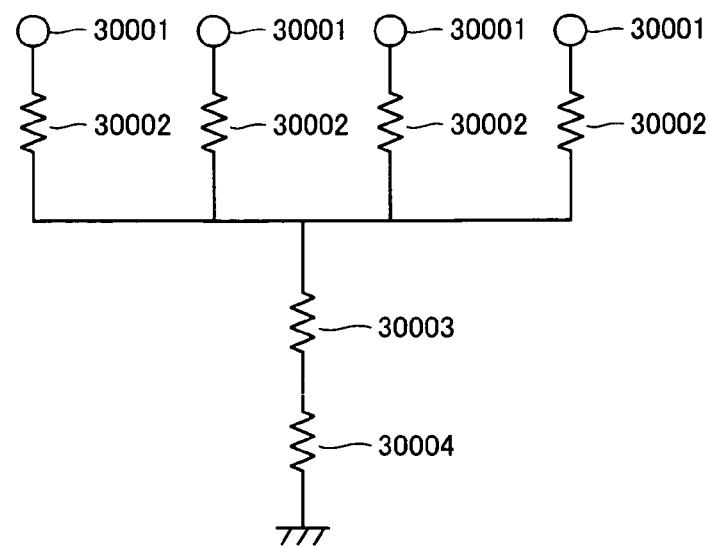
FIG. 14 is a drawing showing a thermal resistance circuit network in the nitride semiconductor laser device shown in FIG. 13.
Figure 15:
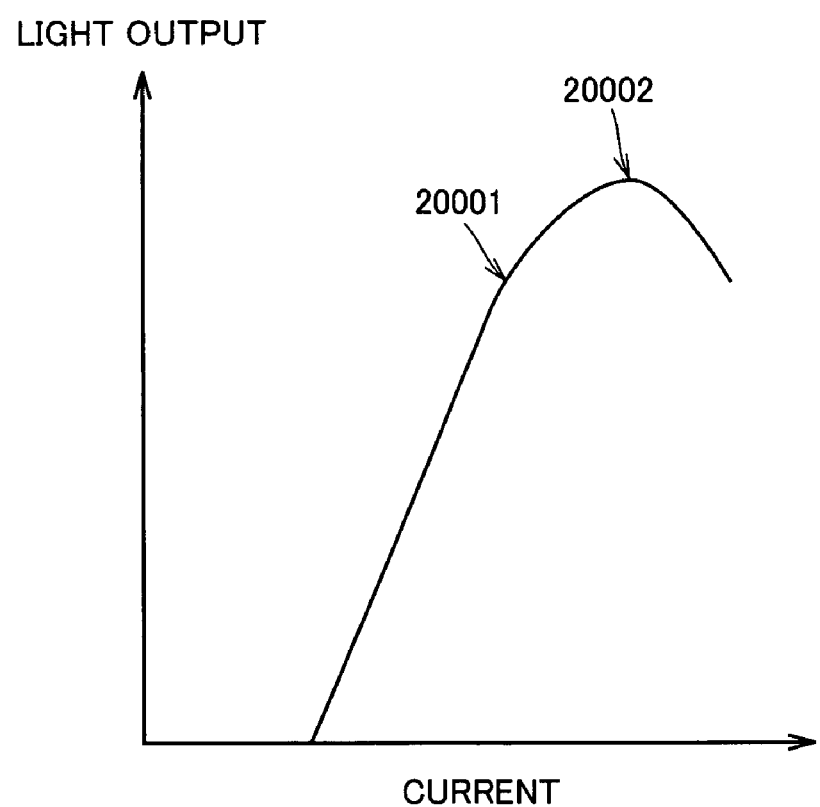
FIG. 15 is a drawing showing a current-light output (I-L) characteristic of the nitride semiconductor laser device shown in FIG. 13.

In the nitride semiconductor laser device of the present invention, a thermal path further through second sub-mount 104 is provided compared with the conventional nitride semiconductor laser device. Therefore, no bad influence is given to the thermal path that is configured with the thermal circuit network in the conventional nitride semiconductor laser device shown in FIG. 14 and, in addition, a thermal path is generated that is configured with the thermal resistances shown as thermal resistances 205, 206, and 207, and with this configuration, the effect of improving thermal radiation characteristics is produced compared with the conventional nitride semiconductor laser device.

<<Manufacturing Method>>

FIG. 4 is a schematic perspective drawing showing a manufacturing process of the nitride semiconductor laser device of the present embodiment. In the following, description is made based on FIGS. 4A to 4D.

Figure 4A:
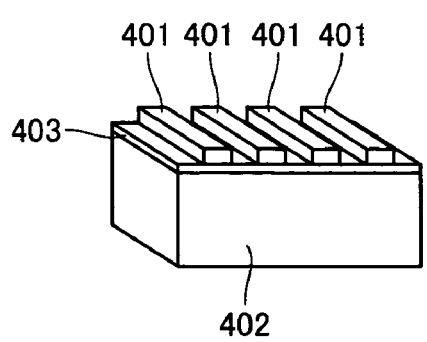
FIG. 4A is a schematic perspective drawing showing one step of a manufacturing process of a nitride semiconductor laser device in Embodiment 1.

First, a step shown in FIG. 4A is described. A layer 403 made of a solder material with a metal layer (not shown) is formed on one surface of a first sub-mount 402. SiC can be used for example as a material of first sub-mount 402. A shape of first sub-mount 402 is made to be 3 mm wide×1.5 mm deep×1 mm thick, for example. The metal layer is configured in the order of Ti (thickness 0.1 µm)/Pt (thickness 0.2 µm)/Au (thickness 0.2 µm) for example from the first sub-mount 402 side. AuSn can be used for example as layer 403 made of a solder material. At this time, the thickness of layer 403 made of a solder material is made to be 3 µm. However, it is desirably thicker than the unevenness range of the thickness of a nitride semiconductor laser element 401 and thinner than the thickness of an n-type substrate of nitride semiconductor laser element 401. A plurality of nitride semiconductor laser elements 401 are arranged on the surface where layer 403 made of a solder material is formed on first sub-mount 401 by a general method of using a die bonding apparatus or the like. At this time, as a plurality of nitride semiconductor laser elements 401, they are preferably arranged so that the surface where the laser beam is taken out matches with the edge of first sub-mount 402 or sticks out from the edge of first sub-mount 402 with a distance of 10 µm or less. This is to prevent the emitted light from nitride semiconductor laser element 401 from being physically shielded by first sub-mount 401.

Figure 4C:
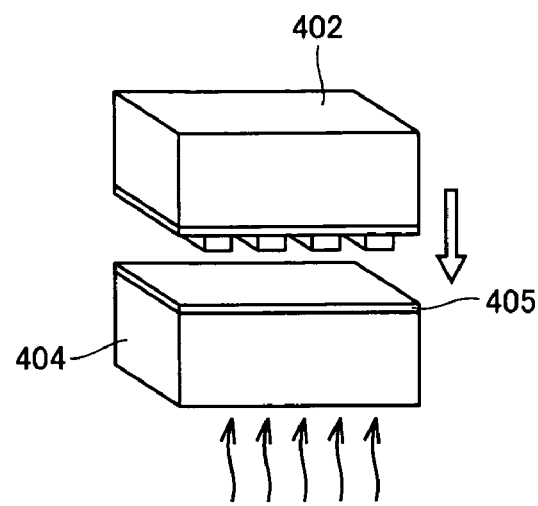
FIG. 4C is a schematic perspective drawing showing one step of the manufacturing process of the nitride semiconductor laser device in Embodiment 1.
Figure 4B:
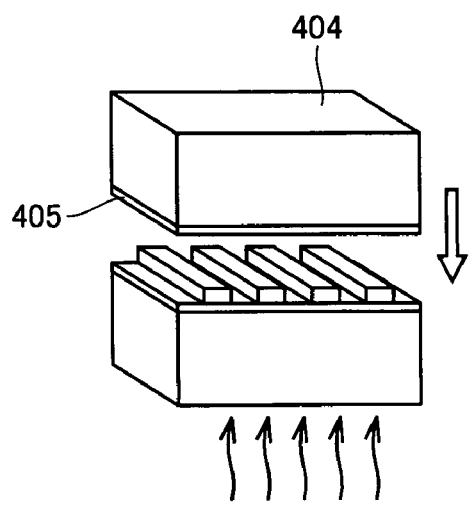
FIG. 4B is a schematic perspective drawing showing one step of the manufacturing process of the nitride semiconductor laser device in Embodiment 1.

Next, a step shown in FIG. 4B is described. The nitride semiconductor laser device is heated as shown by solid arrows in the drawing from the opposite surface of the surface where nitride semiconductor laser elements 401 are arranged on first sub-mount 402 using a semiconductor laser mounting apparatus on the market. At this time, using second a second sub-mount 404, heating is performed in a state in which a plurality of nitride semiconductor laser elements 401 are pressed with a constant load before heating. A completely same one as first sub-mount 402 can be used as second sub-mount 404. That is, in the present embodiment, SiC is used for example as a material of second sub-mount 402, and the shape of second sub-mount 402 can be made to be 3 mm wide×1.5 mm deep×1 mm thick, for example. A metal layer (not shown) that is formed on second sub-mount 404 is configured in the order of Ti (thickness 0.1 µm)/Pt (thickness 0.2 µm)/Au (thickness 0.2 µm) for example from the second sub-mount 404 side. A layer 405 made of a solder material having the same or higher eutectic temperature as layer 405 made of a solder material that is formed on first sub-mount 402, and AuSn can be used for example. The lower limit of the heating temperature is the temperature at which the solder material on the first sub-mount melts, and the heating temperature is set to be a temperature 20 to 30° C. higher than that. The upper limit of the heating temperature using a semiconductor laser mounting apparatus on the market is determined from the viewpoint that reliability of nitride laser semiconductor element 401 does not remarkably decrease, and it is preferably set so that the temperature of nitride semiconductor laser element 401 does not become 300° C. or more.

Figure 4D:
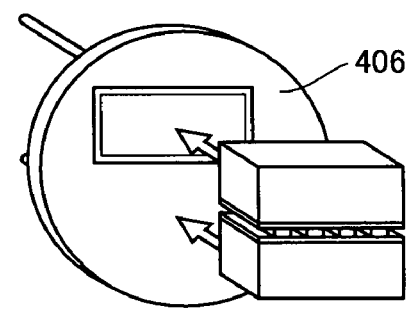
FIG. 4D is a schematic perspective drawing showing one step of the manufacturing process of the nitride semiconductor laser device in Embodiment 1.

Here, in the case of setting a temperature to perform the adhesion of first sub-mount 402 and nitride semiconductor laser element 401 and at the same time, to perform the adhesion of second sub-mount 404 and nitride semiconductor laser element 401, the process proceeds to a step shown in FIG. 4D. In the case of performing only the adhesion of first sub-mount 402 and nitride semiconductor laser element 401 in a step shown in FIG. 4B, the process proceeds to a step shown in FIG. 4C.

Next, a step shown in FIG. 4C is described. First sub-mount 402 to which nitride semiconductor laser element 401 is adhered is arranged on the surface of second sub-mount 404 where a layer 405 made of a solder material is formed. Then, the nitride semiconductor laser device is heated as shown by solid arrows in the drawing from the opposite surface of the surface where layer 405 made of a solder material is formed on second sub-mount 404 in the same way as the heating method in FIG. 4B. The heating temperature is preferably set to 20 to 30° C. higher than the temperature at which layer 405 made of a solder material that is formed on second sub-mount 404 melts as the lower limit. The upper limit of the heating temperature is determined from the viewpoint that the reliability of nitride semiconductor laser element 401 does not remarkably decrease, and is preferably set to a temperature so that the temperature of nitride semiconductor laser element 401 does not become 300° C. or higher. Second sub-mount 404 is desirably arranged so that the surface that takes out the laser beam of a plurality of nitride semiconductor laser elements 401 matches with the edge of the second sub-mount or sticks out from the edge of the second sub-mount with a distance of 10 µm or less. This is to prevent the laser beam from nitride semiconductor laser element 401 from being physically shielded by second sub-mount 404.

Finally, a step shown in FIG. 4D is described. First sub-mount 402 and second sub-mount 404 are adhered to a stem 406 using a solder material (not shown). At this time; it is necessary that the region where each of first sub-mount 402 and second sub-mount 404 is adhered is electrically insulated from each other. The eutectic temperature of the solder material is preferably selected to be the same as or less than that of the solder material that is formed on first sub-mount 402 and second sub-mount 404, and SnAgCu can be selected for example in the present embodiment.

The nitride semiconductor laser device of the present embodiment is manufactured following the above steps.

The above-described various materials can be selected and used appropriately in the embodiments below.

Embodiment 2

<<Structure>>

Figure 5:
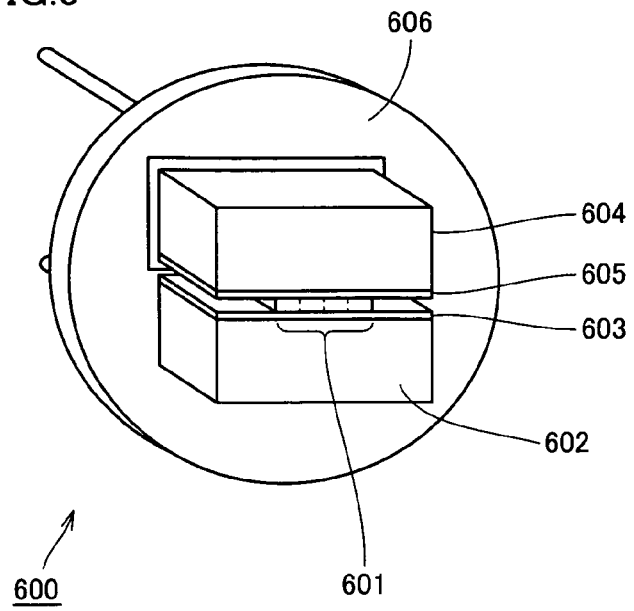
FIG. 5 is a schematic perspective drawing of a nitride semiconductor laser device in Embodiment 2.

FIG. 5 is a schematic perspective drawing of the nitride semiconductor laser device in Embodiment 2 of the present invention. In the following, description is made based on FIG. 5.

In a nitride semiconductor laser device 600 in the present embodiment, the first electrode in a plurality of nitride semiconductor laser elements 601 is connected to a first sub-mount 602 using a solder material 603. Furthermore, the second electrode in a plurality of nitride semiconductor laser elements 601 is connected with a second sub-mount 604 at a position opposite to first sub-mount 602 using a solder material 605. First sub-mount 602 and second sub-mount 604 are connected to a stem 606 using a solder material (not shown).

Furthermore, in nitride semiconductor laser device 600 in the present embodiment, a plurality of nitride semiconductor laser elements 601 are not separated from each other. That is, in other words, nitride semiconductor laser elements 601 are provided with a structure having a plurality of stripe waveguide structures on one n-type substrate in the present embodiment.

In the nitride semiconductor laser device of the present invention, it is necessary that unevenness in the characteristics of each of a plurality of nitride semiconductor laser elements 601 becomes small. According to the present embodiment, the unevenness in the characteristics is small, and effects of shortening the time required for the step of dividing chips and reducing the cost are produced during the manufacturing process of nitride semiconductor laser elements 601.

The same as the nitride semiconductor laser device in Embodiment 1, the nitride semiconductor laser device in Embodiment 2 is high in the thermal radiation efficiency compared with the conventional nitride semiconductor laser device.

Embodiment 3

<<Structure>>

Figure 6:
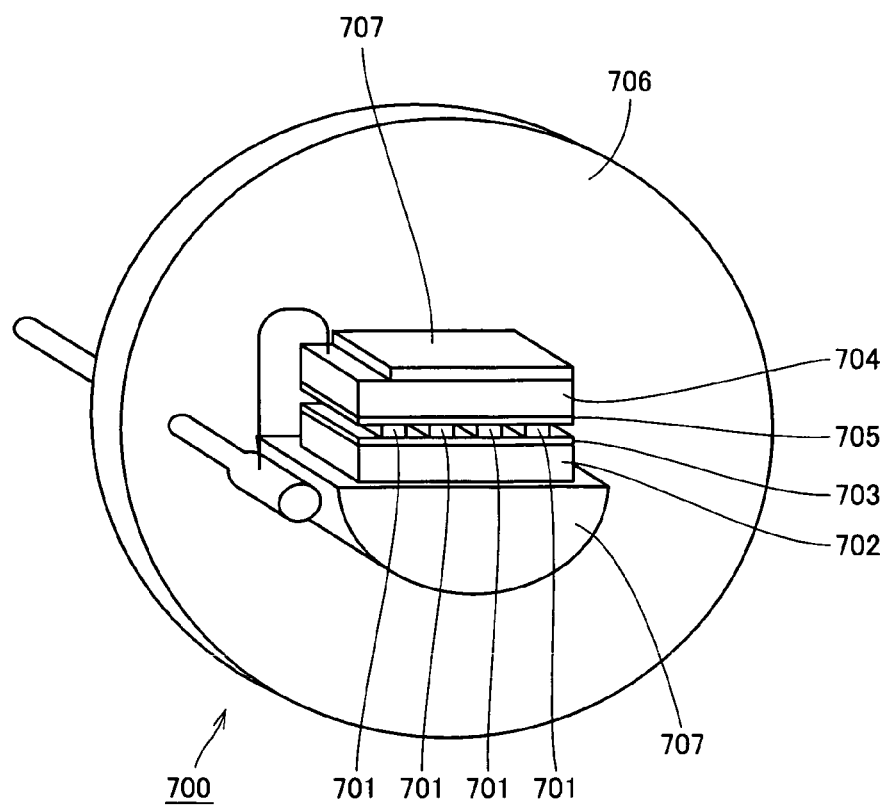
FIG. 6 is a schematic perspective drawing of a nitride semiconductor laser device in Embodiment 3.

FIG. 6 is a schematic perspective drawing of the nitride semiconductor laser device in Embodiment 3 of the present invention. In the following, description is made based on FIG. 6.

The first electrode in a plurality of nitride semiconductor laser elements 701 is connected to a first sub-mount 702 using a solder material 703. Furthermore, the second electrode in a plurality of nitride semiconductor laser elements 701 is connected with a second sub-mount 704 at a position opposite to first sub-mount 702 using a solder material 705.

Furthermore, in a nitride semiconductor laser device 700 in the present embodiment, compared with Embodiment 1, the surface opposed to solder material 703 of first sub-mount 702 is adhered to a heat sink 707 as a thermal radiation material that is formed integrally with a stem 706 that supports an external terminal. The first sub-mount is connected electrically and heat-conductively to stem 706 by heat sink 707. Also in the surface opposed to solder material 705 of second sub-mount 704, second sub-mount 704 and heat sink 707 are connected heat-conductively, and the second sub-mount is connected electrically to an external terminal.

With this configuration, because a stem that is generally used in lasers for CDs and DVDs can be used, it is not necessary to produce a stem with a special shape, and the effect that the cost of the stem can be reduced is produced.

In the present embodiment, it is necessary that the surface where solder material 703 and solder material 705 exist and the opposite surface of either of first sub-mount 702 and second sub-mount 704 are connected electrically to each other.

Therefore, effective are methods such as those using a conductive material such as Cu or CuW as a material for heat sink 707 and vapor-depositing a metal on the side surface of heat sink 707.

In the present embodiment, the thinner the thickness of either of first sub-mount 702 and second sub-mount 704 is, the more it is desired, and the larger the surface area is, the more preferable it is from the viewpoint of the thermal radiation characteristics. Especially, the length of either of the light emitting direction of first sub-mount 702 and second sub-mount 704 is longer than the length of the light emitting direction of the nitride semiconductor laser element.

Here, in nitride semiconductor laser device 700 in the present embodiment, second sub-mount 704 does not physically contact, that is, heat-conductively contact, with stem 706. Because of this, heat sink 707 is provided so as to contact with second sub-mount 704 as a thermal radiation means from second sub-mount 704. This heat sink 707 is adhered to second sub-mount 704 using a solder or the like for example. Heat sink 707 is preferably configured with alumina for example.

The size of heat sink 707 as a thermal radiation material that contacts to second sub-mount 704 does not depend on the material, and it is desirably arranged by extending so that the distance from nitride semiconductor laser element 701 is in the range of 1 µm or more and 10 mm or less. It is more desirably arranged by extending so that the distance is in the range of 10 µm or more and 1 mm or less.

This is because an electromagnetic wave that is generated in the lower side surface of heat sink 707 is absorbed in the inside of heat sink. 707 again before it is radiated outside from the upper side surface of heat sink 707. When the difference in the temperature of a few µm depth from the surface of heat sink 707 and the surface temperature of the stem becomes 5 degrees or less, there is a fear that heat sink 707 does not play a role as a thermal radiation material. From such viewpoint, the upper limit of the thickness of heat sink 707 is determined. The upper limit can be made to be 1000 µm. However, in the present embodiment, the thickness of heat sink 707 is preferably 100 µm or less, and especially preferably 10 µm or less.

Further, the material of heat sink 707 as a thermal radiation material may be other materials besides alumina as long as they have an emissivity of 0.7 or more, and the effect of the present invention is produced as long as it is configured with either of ceramic, a brick, concrete, lacquer, and paint.

Further, in the present invention, the measurement method of the emissivity can be Fourier Transform Infrared Spectrometry (FT-IR).

Here, in the case of the heat sink using lacquer and paint as a thermal radiation material, when second sub-mount 704 itself is produced, a sub-mount material substrate can be used in which lacquer or paint is partially formed on the surface side opposing to solder material 705 of second sub-mount 704 before separating second sub-mount 704 individually, and then separating individually. As a method of partially forming lacquer or paint, a method is used of placing a metallic mask partially having holes open on the sub-mount material substrate before separating individually and then partially forming a film constituted from lacquer or paint using a film coating apparatus or the like from a direction where a hole is open, for example. Examples of the paint that can be used include $Cu_2O_3$ (blue), CuO (black), $Cu_2O_3$ (green), $Fe_2O_3$ (red), $Al_2O_3$ (white), $Y_2O_3$ (white), ZnO (white), $MgCO_3$ (white), $ZrO_2$ (white), $ThO_2$ (white), MgO (white), $PbCO_3$ (white), PbO (yellow), $PbCrO_4$ (yellow), and varnish.

<<Manufacturing Method>>

Figure 7:
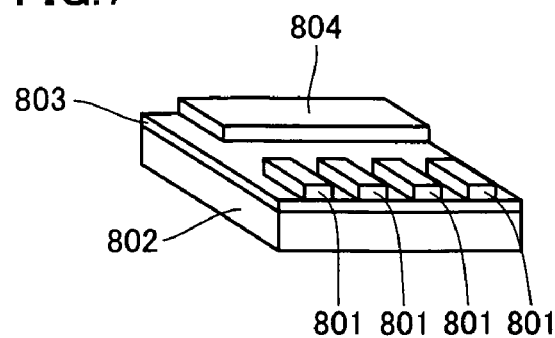
FIG. 7 is a schematic perspective drawing showing a manufacturing process of the nitride semiconductor laser device in Embodiment 3.

FIG. 7 is a schematic perspective drawing of the manufacturing process of the nitride semiconductor laser device of the present embodiment. In the following, description is made based on FIG. 7.

In the present embodiment, in the step shown in FIG. 4A in the above-described Embodiment 1, a spacer 804 made of an insulator is arranged on the surface where a layer 803 made of a solder material of a first sub-mount 802 at a position opposing to a nitride semiconductor laser element 801 looking from the center of gravity of the same surface.

In the case of not arranging this spacer 804, there is a fear that first sub-mount 802 and the layer made of a solder material of the second sub-mount do not become parallel to each other when pressing from the upper side with the second sub-mount (not shown) in a post step. That is, in the present embodiment, the effect is produced that a problem in which the adhesion between the second sub-mount and nitride semiconductor laser element 801 becomes insufficient can be prevented in the case that either of the length of the light emitting direction of first sub-mount 802 and the second sub-mount is longer than the length of the light emitting direction of nitride semiconductor laser element 801.

The difference amount of spacer 804 from the thickness of nitride semiconductor laser element 801 is preferably 0 to 20 μm. Further, a material in which a metal is vapor-deposited on both surfaces of a glass material such as alumina that is polished can be used as spacer 804 for example. This polishing is not described above. However, the thickness of nitride semiconductor laser element 801 and that of spacer 804 approximately match naturally when using a material that is polished at the same time as a polishing step of nitride semiconductor laser element 801, and a step of forming spacer 804 can be dispensed with.

The following manufacturing process in the present embodiment can be performed in the same way as the processes shown in the above-described FIGS. 4B to D.

Embodiment 4

<<Structure>>

Figure 8:
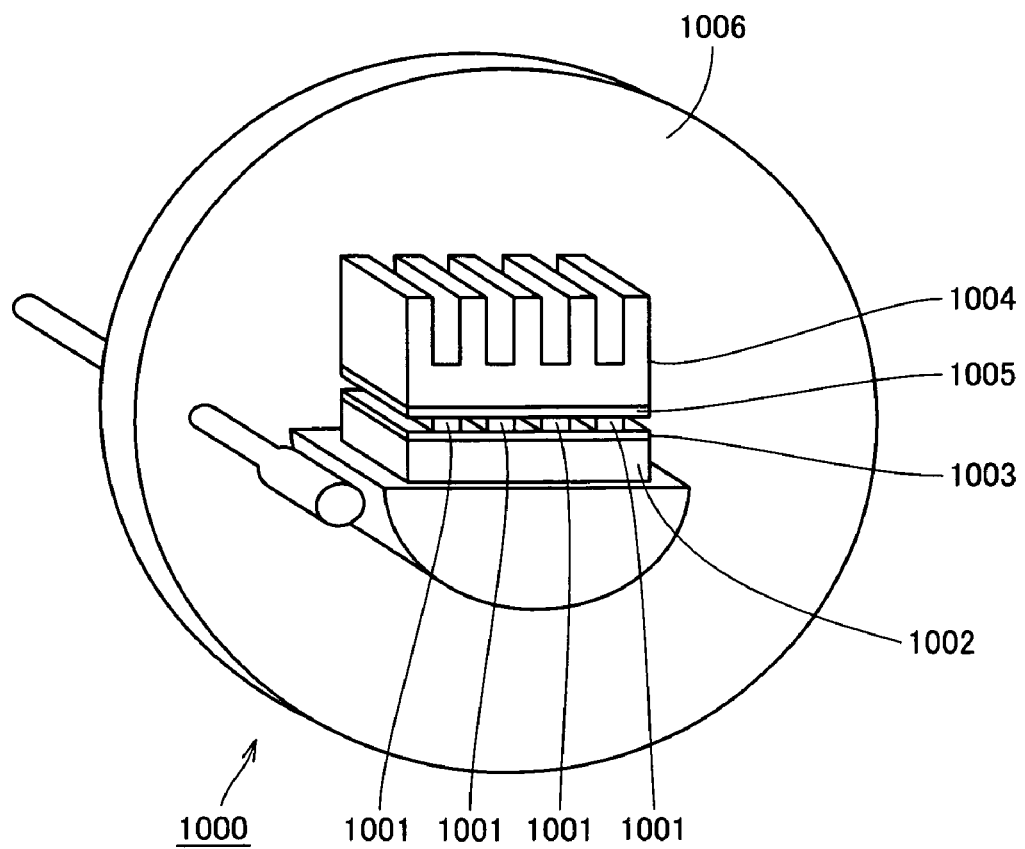
FIG. 8 is a schematic perspective drawing of a nitride semiconductor laser device in Embodiment 4.

FIG. 8 is a schematic perspective drawing of the nitride semiconductor laser device in Embodiment 4 of the present invention. In the following, description is made based on FIG. 8.

In nitride semiconductor laser device 1000 in the present embodiment, the first electrode in a plurality of nitride semiconductor laser elements 1001 is connected to a first sub-mount 1002 using a solder material 1003. Furthermore, the second electrode in a plurality of nitride semiconductor laser elements 1001 is connected with a second sub-mount 1004 at a position opposite to first sub-mount 1002 using a solder material 1005. Then, first sub-mount 1002 and a stem 1006 are thermally and electrically connected.

Furthermore, nitride semiconductor laser device 1000 in the present embodiment is a fin structure with second sub-mount 1004 having a thermal radiation structure compared with Embodiment 3. This fin structure has an objective to radiate heat to the atmosphere or into a liquid efficiently by making the contact area to the open air large and considering the convection of the open air, and there are various structures such as a comb shape and a pinholder shape. The nitride semiconductor laser device of the present invention has a characteristic of radiating heat by increasing the surface area of second sub-mount 1004 and convection.

In the following, the present invention is described in detail referring to examples. However, the present invention is not limited to these.

EXAMPLE 1

Referring to FIG. 4, the present example is described.

First, a step shown in FIG. 4A is described. A layer 403 made of a solder material with a metal layer (not shown) was formed on one surface of a first sub-mount 402. The metal layer was formed in the order of a Ti layer having a thickness of 0.1 μm/a Pt layer having a thickness of 0.2 μm/an Au layer having a thickness of 0.2 μm from the first sub-mount 402 side. A layer made of AuSn having a thickness of 3 μm was formed as layer 402 made of a solder material.

Then, a plurality of nitride semiconductor laser elements 401 were arranged on the surface where layer 403 made of a solder material on first sub-mount 401 using a die bonding apparatus (Model CD-200 Series A manufactured by Tohsoku). At this time, the surface where the laser beam is taken out in the plurality of nitride semiconductor laser elements 401 was matched with the edge of first sub-mount 401.

Next, a step shown in FIG. 4B is described. The nitride semiconductor laser device was heated at 300° C. from the opposite surface of the surface where nitride semiconductor laser elements 401 are arranged in first sub-mount 402 using a semiconductor laser mounting apparatus on the market (Model CD-200 Series A manufactured by Tohsoku). At this time, heating was performed in a state in which a plurality of nitride semiconductor laser elements 401 were pressed with a constant load before heating using a second sub-mount 404. A completely same one as first sub-mount 402 was used as second sub-mount 404. Further, second sub-mount 404 was used on which a layer 405 made of a solder material was formed interposing a metal layer (not shown) therebetween was used. At this time, the same layers as described above were also used as the metal layer and layer 405 made of a solder material in second sub-mount 404.

Next, a step shown in FIG. 4C is described. First sub-mount 402 on which nitride semiconductor laser element 401 was adhered was arranged on the surface where a layer 405 made of a solder material was formed in second sub-mount 404. Then, the nitride semiconductor laser device was heated from the opposite surface of the surface where layer 405 made of a solder material was formed on second sub-mount 404 in the same way as the heating method in FIG. 4B. At this time, the heating temperature was made to be 300° C. Further, in second sub-mount 404, the surface where the laser beam is taken out in the plurality of nitride semiconductor laser elements 401 was matched with the edge of second sub-mount.

Finally, a step shown in FIG. 4D is described. First sub-mount 402 and second sub-mount 404 were adhered to a stem 406 using a solder material (not shown). At this time, in stem 406, the regions where each of first sub-mount 402 and second sub-mount 404 are adhered were electrically insulated from each other. SnAgCu was selected as the solder material.

The nitride semiconductor laser device was manufactured following the above steps.

The manufactured nitride semiconductor laser device is described based on FIG. 1.

Nitride semiconductor laser device 100 has a structure in which two or more nitride semiconductor laser elements 101 are arranged in a direction parallel to the first main surface and in a direction perpendicular to the emitting direction of the light emitted from the stripe waveguide structure. Then, the arrangement of nitride semiconductor laser elements 101 in nitride semiconductor laser device 100 is fixed with a structure in which first sub-mount 102 and the first electrode of nitride semiconductor laser element 101 are electrically and heat-conductively connected and second sub-mount 104 and the second electrode of nitride semiconductor laser element 101 are electrically and heat-conductively connected.

The nitride semiconductor laser element in the present example is described based on FIG. 2. First, an n-type substrate 301 made of GaN that is polished so that the thickness becomes 100 µm was prepared. The nitride laser element was formed by layering an n-type GaN layer 302 (film thickness 3 µm), an n-type buffer layer 303 made of $In_{0.05}Ga_{0.95}N$, an n-type cladding layer 304 made of $Al_{0.05}Ga_{0.95}N$ (film thickness 2.0 µm), an n-type optical waveguide layer 305 made of GaN (film thickness 0.1 µm), an n-type active layer 306 having an $In_{0.2}Ga_{0.8}N$/n-type $In_{0.05}Ga_{0.95}N$ triple quantum well structure (film thickness 40 angstrom each/80 angstrom×3 MQW (quantum well)), a p-type carrier stop layer 307 made of $Al_{0.2}Ga_{0.8}N$ (film thickness 200 angstrom), a p-type optical waveguide layer 308 made of GaN (film thickness 0.1 µm), a p-type cladding layer 309 made of $Al_{0.05}Ga_{0.95}N$ (film thickness 0.5 µm), and a p-type contact layer 310 made of GaN (film thickness 0.2 µm) one by one on the second main surface of n-type substrate 301 made of GaN. Further, a ridge shaped stripe 312 was formed on a part of an upper structure of n-type active layer 306 by etching to reach p-type cladding layer 309. In the present example, the active layer and the optical waveguide layer have an optical confinement waveguide structure sandwiched by the cladding layers, and the light that is emitted in the active layer is confined in this waveguide structure and generates a laser oscillation operation.

Further, a structure was made by forming a p-type contact electrode 311 on p-type contact layer 310 that remained without being etched, and forming an insulating film 313 and a metal layer 316 made of Mo having a thickness of 0.1 µm or less. Further, a p-type electrode pad 314 having a thickness of 3 µm was formed so as to contact with p-type contact electrode 310.

COMPARATIVE EXAMPLE 1

Figure 9:
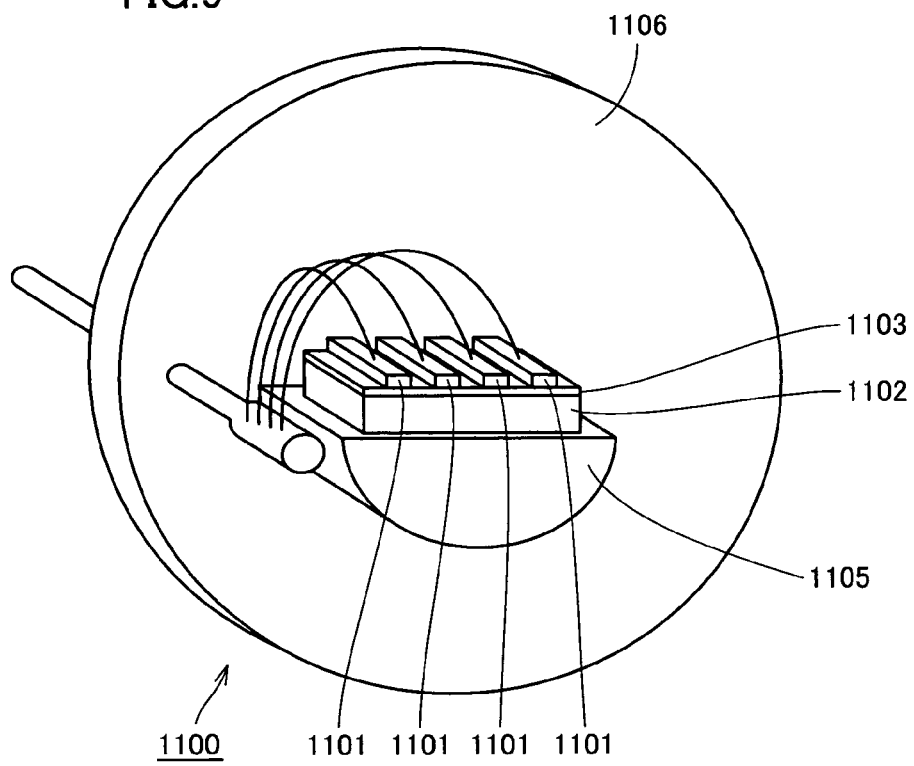
FIG. 9 is a schematic perspective drawing showing a conventional nitride semiconductor laser device that is not provided with a second sub-mount of the present invention.

FIG. 9 is a schematic perspective drawing showing a conventional nitride semiconductor laser device that is not provided with the second sub-mount of the present invention. Here, in a nitride semiconductor laser device 1100, a plurality of nitride semiconductor laser elements 1101 were loaded at a position where the PN junction surface side is bonded to a sub-mount 1102 using a solder material 1103, in a so-called junction down arrangement. Sub-mount 1102 was bonded to a heat sink 1105 that was welded to a stem 1106.

<<Comparison of Performance>>

Figure 10:
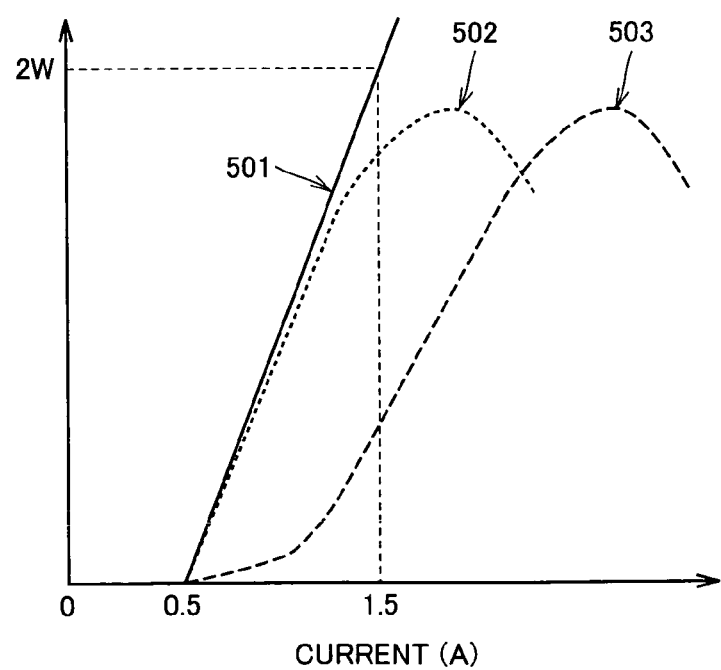
FIG. 10 is a drawing showing a current-light output (I-L) characteristic of a nitride semiconductor laser device in Example 1 and other nitride semiconductor laser devices.
Figure 11:
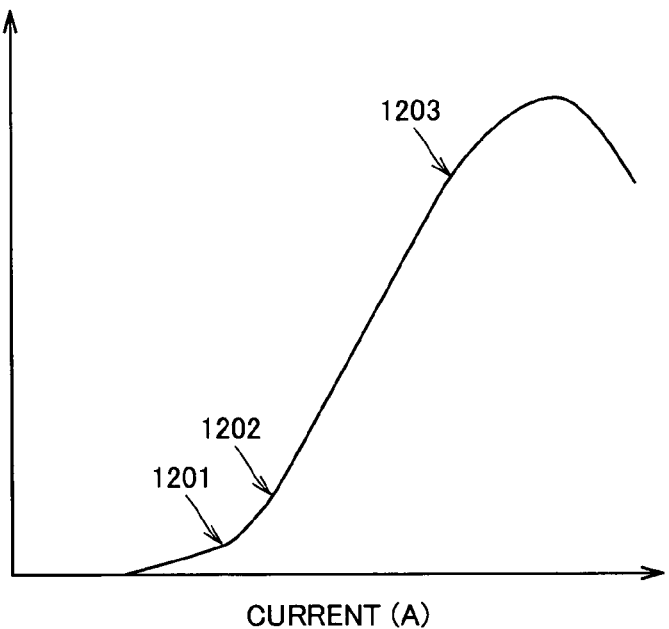
FIG. 11 is a drawing showing a current-light output (I-L) characteristic of a nitride semiconductor laser device in Comparative Example 1.
Figure 13:
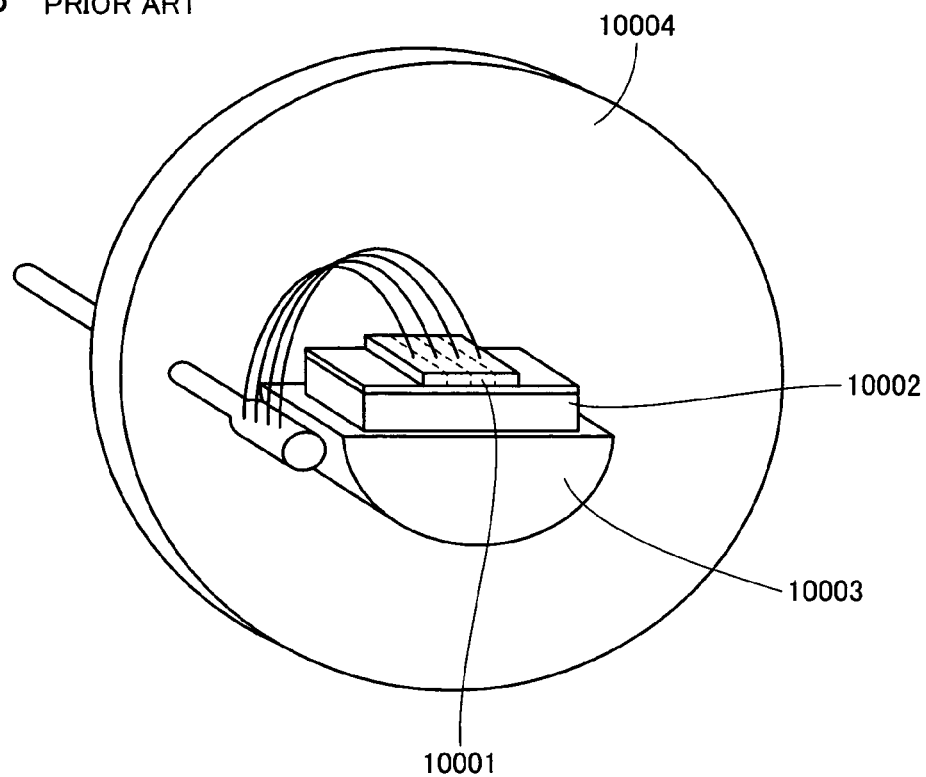
FIG. 13 is a schematic drawing showing a configuration of a conventionally investigated nitride semiconductor laser device.

FIG. 10 is a drawing showing a current-light output (I-L) characteristic of the nitride semiconductor laser device of the present embodiment and other nitride semiconductor laser devices. In FIG. 10, data 501 show the I-L characteristic in the nitride semiconductor laser device in Example 1. Data 502 show the data in FIG. 13 for comparison. Further, data 503 show the I-L characteristic of the nitride semiconductor laser device in Comparative Example 1. The vertical axis and the horizontal axis in FIG. 10 show arbitrary values. Further, FIG. 11 shows the current-light output (I-L) characteristic of the nitride semiconductor laser device of Comparative Example 1.

First, description is made based on FIG. 10.

An I-L characteristic measurement was performed in the state in which the temperature was kept constant using a Peltier device so that the stem in the nitride semiconductor laser device of the present invention becomes 25° C. Further, in the I-L characteristic measurement, the current was increased by injecting electric power by adding 1 mA every 1 second from 0 mA using a constant current source.

Data 501 in the nitride semiconductor laser device of the present invention showed a linear I-L characteristic from the time of injection of low electric power compared with data 503. This is because a plurality of nitride semiconductor laser elements were connected through the layer made of a solder material by pressing uniformly using the second sub-mount, and therefore the unevenness in the connection state in every nitride semiconductor laser element was suppressed and all of the nitride laser elements came to oscillate with almost the same applied electric power.

Furthermore, in data 501, saturation of the light output did not occur up to the time of injecting a higher electric power compared with data 502 and data 503. This is considered to be because the thermal path increased by using the second sub-mount in the nitride semiconductor laser device of the present invention and the thermal radiation characteristics improved, and therefore an increase in the temperature of the nitride semiconductor laser element was suppressed.

Next, FIG. 11 is described.

An inflection point of the I-L characteristic was confirmed at a point 1201 and a point 1202 in FIG. 11. Then, it was found that the efficiency of the original light output of the nitride semiconductor laser element was not obtained at a lower current value than at point 1202. This is considered to be because unevenness in the connection state of a plurality of nitride semiconductor laser elements and the sub-mount occurred due to the nitride semiconductor laser element in Comparative Example 1. This is because the thermal radiation characteristic differs depending on the nitride semiconductor laser element due to the unevenness, and the applied electric power value that is laser-oscillated differs depending on the nitride semiconductor laser element. Further, a linear I-L characteristic is shown at a higher current value than at point 1202. However, at a higher current value than at point 1203, it was confirmed that the light output shows saturation, the effect of decreasing the light output due to the generation of heat exceeds the improvement in the light output even when a current is applied afterward, and the light output shows a tendency of decreasing because of the heat generation from the nitride semiconductor laser element.

From the above, it was shown that the I-L characteristic of the nitride semiconductor laser device in Example 1 is superior.

EXAMPLE 2

In the following, description is made by referring to FIG. 5.

In the present example, a nitride semiconductor laser device 600 was produced, which was different from Example 1 in that a plurality of nitride semiconductor laser elements 601 are not separated from each other. That is, in other words, nitride semiconductor laser elements 601 were provided with a structure having a plurality of stripe waveguide structures on one n-type substrate in the present example.

According to the present embodiment, effects were produced of which the unevenness in the characteristics is small, the time of the manufacturing process of nitride semiconductor laser elements 601 is shortened, and the cost is reduced.

EXAMPLE 3

Referring to FIGS. 6 and 7, the present example is described.

First, description is made based on FIG. 7.

In the present example, in the step shown in FIG. 4A in the above-described Example 1, a spacer 804 made of an insulator was arranged on the surface where a layer 803 made of a solder material exists of a first sub-mount 802 at a position opposite to a nitride semiconductor laser element 801 as observed from the center of gravity of the same surface. The same nitride semiconductor laser element as described above in Example 1 was used as nitride semiconductor laser element 801.

In the case of not arranging this spacer 804, there is a fear that first sub-mount 802 and the layer made of a solder material of the second sub-mount do not become parallel to each other when pressing from the upper side with the second sub-mount (not shown) in a post step. That is, in the present embodiment, the effect is produced that a problem in which the adhesion between the second sub-mount and nitride semiconductor laser element 801 becomes insufficient can be prevented in the case that either of the length of the light emitting direction of first sub-mount 802 and the second sub-mount is longer than the length of the light emitting direction of nitride semiconductor laser element 801.

The difference amount of spacer 804 from the thickness of nitride semiconductor laser element 801 that was used was 20 μm or less. Further, a material in which a metal was vapor-deposited on both surfaces of a glass material such as alumina that was polished was used as spacer 804. For the polishing of alumina, a material was used that was polished at the same time when polishing nitride semiconductor laser element 801 for finishing.

The following manufacturing processes in the present embodiment were performed in the same way as the processes shown in the above-described FIGS. 4B to D.

Next, description is made based on FIG. 6.

Figure 12:
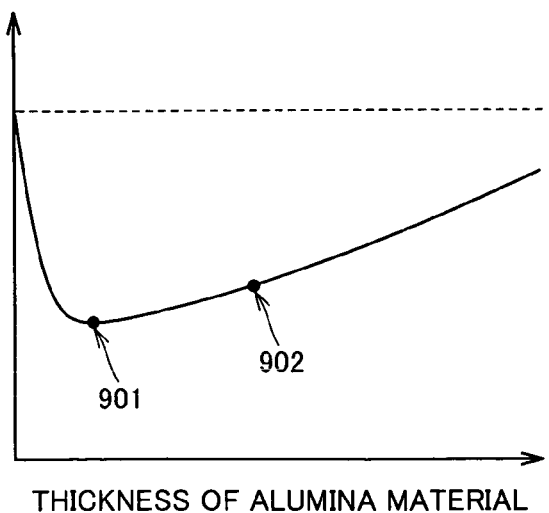
FIG. 12 is a drawing plotted by taking a thickness of an alumina material in the horizontal axis and an average temperature of a p-n junction plane of a nitride semiconductor laser element in the vertical axis.

Furthermore, compared with Example 1, a nitride semiconductor laser device 700 was made to have a structure in which the surface opposite to a solder material 703 of a first sub-mount 702 is adhered to a heat sink 707 that is formed integrally with a stem 706, and the heat sink is connected thermally to the surface opposite to a solder material 705 of a second sub-mount 704. Then, an alumina material was used in heat sink 707. FIG. 12 is a drawing plotted by taking the thickness of the alumina material in the horizontal axis and the average temperature of a PN junction plane of the nitride semiconductor laser element in the vertical axis. Here, the average temperature of the PN junction plane of nitride semiconductor laser element 701 can be calculated from the light output and the injected current value of nitride semiconductor laser element 701 with a method described in "Semiconductor Laser" (Baifukan Co., Ltd) written by Ryoichi Itoh and Michiharu Nakamura by considering the temperature characteristic of nitride semiconductor laser element 701. The values of the horizontal axis and the vertical axis are relative values.

From FIG. 12, it was found that the average temperature of the PN junction plane of nitride semiconductor laser element 701 rapidly decreases when increasing the thickness of the alumina material to the region from a point 0 to a point 901. This showed that the intensity of the electromagnetic wave that is necessary for the thermal radiation cannot be obtained and it does not play a role as heat sink 707 when the thickness of the alumina material as heat sink 707 is too thin. This is the same also in the case of using other heat sink 707 other than the alumina material. Then, it was found that the effect is produced in the case that the thickness of heat sink 707 is 0.01 μm or more.

Furthermore, when the thickness of the alumina material as heat sink 707 is increased from point 901, the temperature of the PN junction plane of the nitride semiconductor laser element starts to increase again when it exceeds a point 902, and a tendency was shown that it becomes closer to the temperature when the thickness is 0. This was considered to be because the electromagnetic wave that is generated on the surface of-the lower side of the alumina material is absorbed inside the alumina material again before it is radiated from the surface of the upper side into the outside. This was considered to be because it does not play a role as the thermal radiation material when the difference of the temperature up to a few μm depth from the surface of the alumina material with the temperature of the stem as a housing becomes 5 degrees or less.

A measurement method of the emissivity was Fourier Transform Infrared Spectrometry (FT-IR).

EXAMPLE 4

In the following, the present example is described based on FIG. 8.

A nitride semiconductor laser device 1000 in which a second sub-mount 1004 has a fin structure was adopted in the present example compared with Example 3. This fin structure has an objective to radiate heat to the atmosphere or into a liquid efficiently by making the contact area to the open air larger and considering convection of the open air, and there are various structures such as a comb shape and a pinholder shape.

With this, the heat of nitride semiconductor laser device 1000 was able to be radiated by increasing the surface area of the second sub-mount and convection.

Although the present invention has been described and illustrated in detail, it is clearly understood that the same is by way of illustration and example only and is not to be taken by way of limitation, the scope of the present invention being interpreted by the terms of the appended claims.

What is claimed is:
1. A nitride semiconductor laser device comprising:
at least two nitride semiconductor laser elements; and
a sub-mount structure,
wherein said sub-mount structure includes one first sub-mount and one second sub-mount, the second sub-mount having a level lower face,
wherein said nitride semiconductor laser elements have at least a first electrode on a first main surface of a first conductive type conductive substrate, at least a first conductive type nitride semiconductor layer, an active layer, a second conductive type nitride semiconductor layer, and a second electrode on a second main surface of said conductive substrate, and a stripe waveguide structure parallel to said first main surface,
two or more nitride semiconductor laser elements are arranged in a direction parallel to the first main surface and a direction perpendicular to the direction of light that is emitted from said stripe waveguide structure,
said first sub-mount and an entire first surface of said first electrode of all said nitride semiconductor laser elements are electrically and heat-conductively connected,
said second sub-mount and an entire second surface of said second electrode of all said nitride semiconductor laser elements are electrically and heat-conductively connected,
all said nitride semiconductor laser elements are separated from each other, all said nitride semiconductor laser elements are sandwiched between said one first sub-mount and said one second sub-mount, and said first sub-mount and said second sub-mount are configured to respectively contact the entire first and second surfaces of all said nitride semiconductor laser elements.

2. The nitride semiconductor laser device according to claim 1, wherein at least one of said first sub-mount and said second sub-mount is constituted with a material having a heat conductivity of 100 W/m·K or more.

3. The nitride semiconductor laser device according to claim 1, wherein said first sub-mount and said second sub-mount are constituted with a material selected from SiC, Cu, CuW, AlN, diamond, CuMo, and Ag.

4. The nitride semiconductor laser device according to. claim 1, wherein said nitride semiconductor laser elements have one of said stripe waveguide structure.

5. The nitride semiconductor laser device according to claim 1, wherein the dimension in said light emitting direction of said first sub-mount and said second sub-mount is longer than the dimension in said light emitting direction of said nitride semiconductor laser elements.

6. The nitride semiconductor laser device according to claim 1, wherein the dimension in the thickness direction of said nitride semiconductor laser elements of said first sub-mount and said second sub-mount is 0.2 mm or more and 10 mm or less.

7. The nitride semiconductor laser device according to claim 1, wherein a spacer made of an insulator having a thickness different from that of said nitride semiconductor laser elements by 0 to 20 µm is sandwiched between said first sub-mount and said second sub-mount at a position opposite to said nitride semiconductor laser elements as observed from the center of gravity of said surface of the side in which the area of the surface parallel to the first main surface in said first sub-mount and said second sub-mount is smaller.

8. The nitride semiconductor laser device according to claim 1, wherein said first sub-mount and said second sub-mount are connected with said nitride semiconductor laser elements with a conductive adhesive material interposed there between.

9. The nitride semiconductor laser device according to claim 8, wherein said conductive adhesive material is a eutectic material.

10. The nitride semiconductor laser device according to claim 9, wherein said eutectic material has the same eutectic temperature in the first sub-mount side and the second sub-mount side.

11. The nitride semiconductor laser device according to claim 1, wherein each of said first sub-mount and said second sub-mount is electrically and heat-conductively connected to a stem that is supporting an external terminal.

12. The nitride semiconductor laser device according to claim 1, wherein either one of said first sub-mount and said second sub-mount is electrically and heat-conductively connected to a stem that is supporting an external terminal, and the other one is electrically connected to said stem.

13. The nitride semiconductor laser device according to claim 12, wherein one of said first sub-mount and said second sub-mount has a thermal radiation structure that is a fin structure.

14. The nitride semiconductor laser device according to claim 12, wherein said thermal radiation structure is a structure in which either of said first sub-mount and said second sub-mount contacts with a heat emitting material having an emissivity of 0.7 or more.

15. The nitride semiconductor laser device according to claim 14, wherein said heat emitting material is constituted of any material selected from alumina, a brick, concrete, lacquer, and paint.

16. The nitride semiconductor laser device according to claim 1, wherein all said nitride semiconductor laser elements are physically spaced apart from each other.

* * * * *